(12) United States Patent
Grasset et al.

(10) Patent No.: US 6,778,019 B2
(45) Date of Patent: Aug. 17, 2004

(54) METHOD AND DEVICE FOR BIASING A TRANSISTOR OF A RADIO FREQUENCY AMPLIFIER STAGE

(75) Inventors: Jean-Charles Grasset, Moirans (FR); Frederic Bossu, San Diego, CA (US)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/325,589

(22) Filed: Dec. 20, 2002

(65) Prior Publication Data

US 2003/0227329 A1 Dec. 11, 2003

(51) Int. Cl.[7] .............................................. H03F 3/04
(52) U.S. Cl. ....................... 330/296; 330/297; 330/290
(58) Field of Search ................................ 330/267, 296, 330/297, 290

(56) References Cited

U.S. PATENT DOCUMENTS 4,105,944 A * 8/1978 Anderson .................... 330/290

* cited by examiner

Primary Examiner—Michael B. Singleton
(74) Attorney, Agent, or Firm—Lisa K. Jorgenson; Jose Gutman Fleit, Kain, Gibbons, Gutman, Bongini & Bianco P.L.

(57) ABSTRACT

A biasing device includes closed-loop transconductance slaving circuit, able to slave the time average of the base/emitter or gate/source voltage of the amplifier transistor (Q1) to a reference voltage corresponding to a desired quiescent current for the transistor. Moreover, viewed from the base or gate of the amplifier transistor (Q1), the impedance of the base/emitter or gate/source circuit is small at low frequency, and large with respect to the impedance of the radio frequency source within the radio frequency range of the signal. The device can be incorporated in a mobile terminal, such as a cellular mobile phone.

59 Claims, 6 Drawing Sheets

METHOD AND DEVICE FOR BIASING A TRANSISTOR OF A RADIO FREQUENCY AMPLIFIER STAGE

CROSS-REFERENCE TO RELATED APPLICATION

This application is based upon and claims priority from prior French Patent Application No. 01 16600, filed on Dec. 20, 2001, the entire disclosure of which is herein incorporated by reference.

BACKGROUND OF THE INVENTION

1. Field of the Invention

The invention relates to radio frequency amplification stages, and especially to the biasing of these stages.

2. Description of the Related Art

Radio frequency amplification stages have specific constraints according to their functions.

Thus, the stages which process weak signals in reception require low consumption, a low noise level, a high compression point, weak small signal intermodulation, and a controlled drifting of the quiescent current with temperature.

Transmission amplification stages on the other hand require process-dependent stabilized consumption, a low noise level, a high compression point, weak large signal intermodulation, and a controlled drifting of the quiescent current with temperature.

It is recalled here that the compression point of an amplifier stage is the input power beyond which the corresponding output power deviates by 1 dB from the theoretical output power corresponding to linear operation of the stage.

Thus, the higher the compression point, the bigger the input power range corresponding to a zone of linear operation.

Moreover, intermodulation is manifested by the appearance of intermodulation lines in a communication channel, causing degradation of the signal/noise ratio, or else a phase trajectory error, and in the particular case of transmission, pollution of the adjacent channels.

This intermodulation may be manifested in reception by the value in dBm of an order 3 interception point (IIP3) according to terminology well known to the person skilled in the art. The higher the value of this point, the weaker the intermodulation and consequently the better the reception.

This intermodulation can be manifested in transmission by the value of the power ratio of the adjacent channel (ACPR: "Adjacent Channel Power Ratio") according to terminology likewise well known to the person skilled in the art.

And the smaller this ratio, the weaker the intermodulation.

It may be shown that most of the performance required for the amplifier stage depends a great deal on the biasing block adopted for this amplifier stage. Currently, design techniques based on discrete components, emanating from AsGa technology, are widely used, for example in biasing circuits of the type of that which may be found in the power amplifier from the company RFMD, referenced RF2138, and used for example in wireless communication systems based on the GSM standard.

However, this type of biasing circuit suffers from two major drawbacks, namely poor control of the current, giving rise to an absolute error and a drift with temperature, and a static and dynamic impedance exhibited on the base of the radio frequency amplifier transistor, which is equivalent to a static resistance. In fact, exhibiting a static resistance on the base of the radio frequency transistor gives rise to a limitation of the compression point, as well as to a degradation of the noise of the amplifier stage and a reduction in the linearity performance of the stage.

More recently, an article by Stephen L. Wong, entitled "A 2.7–5.5 V, 0.2–1 W BiCMOS RF Driver Amplifier IC with Closed-Loop Power Control and Biasing Functions" IEEE, Journal of Solid-State Circuits, Vol. 33, No. 12, December 1998, as well as the corresponding U.S. Pat. No. 5,760,651, have described a biasing circuit based on the active simulation of an inductance and using an operational voltage amplifier to copy the reference voltage of a diode onto the base of the power transistor. This reference diode is connected to an independent ground of the radio frequency circuit, thereby greatly limiting the benefits that may be derived from this type of bias.

Moreover, during use in transmission mode, this configuration also limits the characteristics of the adjacent channel power ratio (ACPR) which can be obtained.

Finally, this type of embodiment is subject to serious dispersions in quiescent current on account, on the one hand, of the offset voltage of the biasing amplifier, and, on the other hand, of the inaccuracy of the ratio of geometry between the reference diode and the radio frequency amplifier transistor.

The article by Sifen Luo, entitled "A Monolithic SI PCS-CDMA Power Amplifier with an Impedance-Controllable Biasing Scheme", 2001, IEEE, International Microwave Symposium, describes a more complex biasing scheme, based on current mirrors with two control currents. Thus, one of the currents is presumed to control the quiescent current in the final power stage, whilst a second current separately controls the impedance exhibited by the output of the biasing stage.

Now, the control of the quiescent currents in the transistor of the final power stage remains very inaccurate, both in terms of absolute value and also temperature. Furthermore, the system for controlling the output impedance through the second current substantially influences the final bias current of the power stage, it being impossible to disregard this when it is known that one is dealing with that stage of a mobile telephone having the greatest consumption.

Furthermore, this arrangement does not make it possible to achieve high compression points on account, in particular, of the base resistance which tends to de-bias the transistor when its base current increases.

An article by Eiji Taniguchi, entitled "Dual Bias Feed SiGe HBT Low Noise Linear Amplifier" 2001, IEEE, International Microwave Symposium, again presents the problem of the limitation of compression inherent in biasing stages with current mirrors possessing a resistance to access to the base of the radio frequency transistor, which is generally of high value for noise considerations.

The solution advocated in this article consists in short-circuiting this biasing stage, through a network of three diodes. However, such a solution suffers from the drawback of exhibiting a point of triggering of the short-circuit transistors which depends on the pairing of the radio frequency transistors and on the chain of these three short-circuit transistors. The reproducibility of performance may therefore be jeopardized. Moreover, this type of solution does not afford any improvement as regards intermodulation.

Finally, an article by Keng Leong Fong, entitled "High-Frequency Analysis of Linearity Improvement Technique of Common-Emitter Transconductance Stage Using a Low- Frequency-Trap Network", IEEE, Journal of Solid-State Circuits, Vol. 35, No. 8, August 2000, describes the presence of a "trap" filter tuned to the frequency of spacing of the tones used for an intermodulation test. This filter, which is placed in parallel with the biasing circuit, increases the order 3 interception point, but does not change the compression point.

Furthermore, the obligatory construction outside of the integrated circuit of this resistive/inductive/capacitive "trap" filtering network, tuned to frequencies lying between 100 KHz and 10 MHz according to the transmission standards used, represents a major drawback for this technique.

Accordingly, there exists a need for overcoming the disadvantages of the prior art as discussed above.

SUMMARY OF THE INVENTION

According to a preferred embodiment of the present invention, a method of biasing a transistor of a radio frequency amplifier stage includes receiving an input signal at an amplifier transistor, the input signal being provided from a radio frequency signal source;

closed-loop transconductance slaving a time average voltage of a base/emitter or gate/source of the amplifier transistor to a reference voltage corresponding to a desired quiescent current for the amplifier transistor; and setting an input circuit impedance of a base/emitter or gate/source circuit of the amplifier transistor, as viewed from the base or gate of the amplifier transistor, to a small value at a low frequency of the input signal, and to a large value with respect to an output circuit impedance of the radio frequency signal source at a radio frequency of the input signal.

Further, according to a preferred embodiment of the present invention, an electronic device can provide bias for a transistor of a radio frequency amplifier stage intended for processing a modulated radio frequency signal emanating from a radio frequency source, the electronic device includes:

an input at an amplifier transistor for receiving an input signal provided from a radio frequency signal source; and closed-loop transconductance slaving means for slaving a time average voltage of the base/emitter or gate/source voltage of the amplifier transistor to a reference voltage corresponding to a desired quiescent current for the amplifier transistor, and wherein an input circuit impedance of a base/emitter or gate/source circuit of the amplifier transistor, as viewed from the base or gate of the amplifier transistor, the input circuit impedance of the base/emitter or gate/source circuit is a small value at a low frequency of the input signal, and large value with respect to an output circuit impedance of the radio frequency signal source at a radio frequency of the input signal.

The invention proposes also a mobile terminal, such as a cellular mobile phone.

BRIEF DESCRIPTION OF THE DRAWING

Other advantages and characteristics of the invention will become apparent on examining the detailed description of embodiments and modes of implementation, which are in no way limiting, and the appended drawings, in which.

DESCRIPTION OF THE PREFERRED EMBODIMENTS

Figure 1:
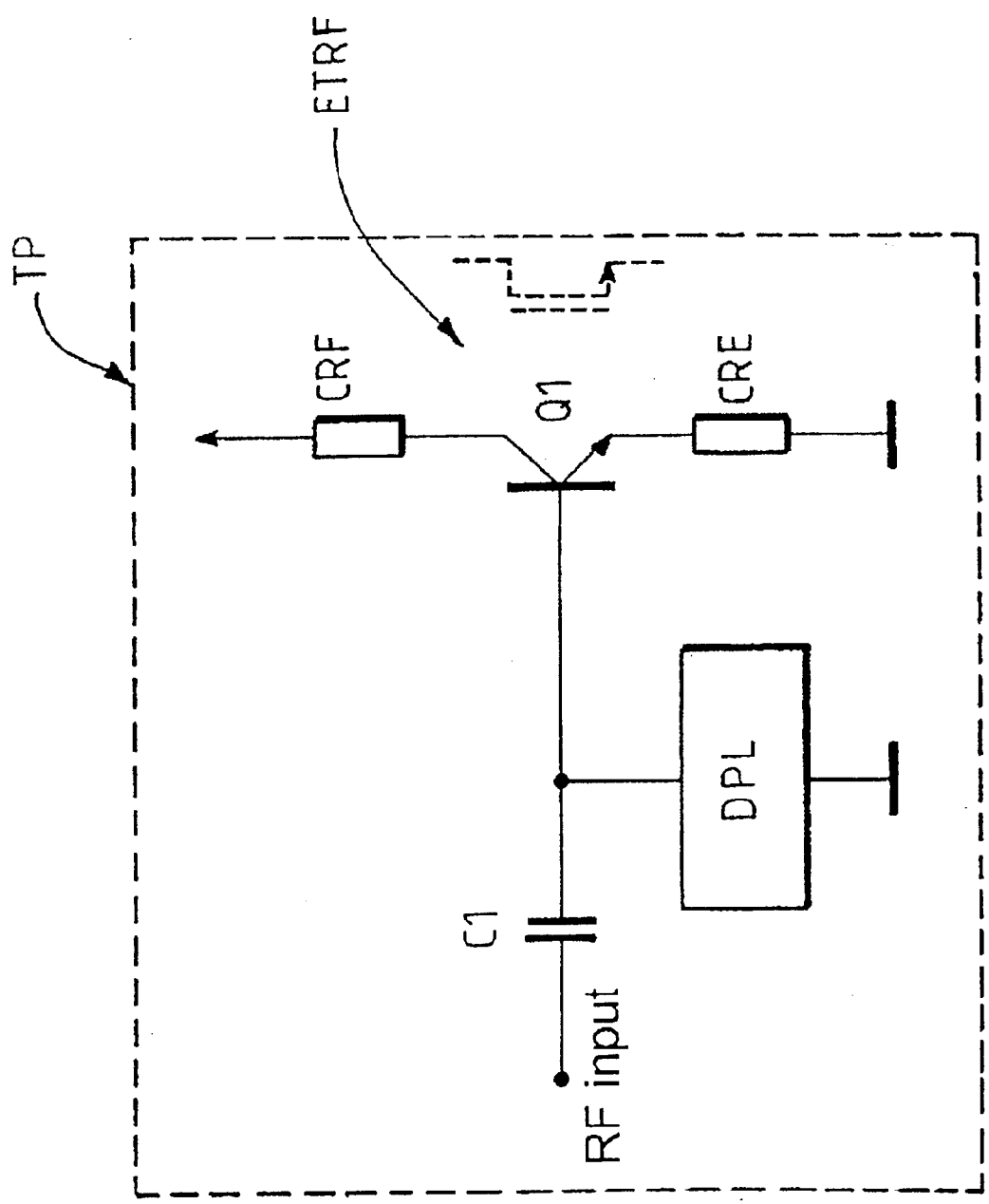
FIG. 1 very diagrammatically illustrates an amplifier transistor of an amplification state equipped with a biasing device, according to the invention.

The invention aims to afford a radically different solution to all the problems discussed above.

An aim of the invention is to propose an improvement in terms of compression, both as regards the power stages and the reception stages.

The aim of the invention is also to afford an improvement in terms of linearity in the sense of the order 3 interception point for the reception stages, and in the sense of the ACPR for the power stages.

An aim of the invention is also to offer good absolute accuracy of the output current, as well as a very low drift with temperature.

An aim of the invention is also to propose a very appreciable improvement to the order 3 intermodulation, without requiring the use of external inductive/capacitive components of high value, nor integration of bulky passive components.

A preferred embodiment of the invention therefore proposes a method of biasing a transistor of a radio frequency amplifier stage intended for processing a modulated radio frequency signal emanating from a radio frequency source.

According to a general characteristic of the invention, the time average of the base/emitter or gate/source voltage of the amplifier transistor is slaved by a closed-loop transconductance slaving to a reference voltage corresponding to a desired quiescent current for the amplifier transistor.

Moreover, an impedance of the base/emitter or gate/source circuit is chosen which, viewed from the base or gate of the amplifier transistor, is small at low frequency, that is to say for example in a first frequency range extending from the zero frequency (in the case of a bipolar transistor) to a predetermined frequency greater than the passband of the modulation of the signal in a ratio of a few units, for example in a ratio of 2 to 5.

Choosing a small circuit impedance, in particular at the zero frequency, allows a very appreciable improvement in the compression of the radio frequency stage as compared with a resistive conventional base bias.

Choosing as upper limit of the first frequency range, a frequency greater than the passband of the modulation of the signal in a ratio of a few units, makes it possible to encompass a frequency equal to that of the spacing of the tones during a response to two-tone intermodulation tests. This also makes it possible to encompass a frequency equal to that of the envelope modulation in the case of modulation with non-constant envelope, as for example for the wireless communication systems governed by the WCDMA standard.

By way of indication, the frequency of spacing of the tones in the case of a response to two-tone intermodulation tests used for a transmission system governed by the GSM standard, lies in the region of 800 KHz, this corresponding to four times the pass band of the modulation of the signal (width of the channel) equal in this instance to 200 KHz.

In the case of a communication system using modulation governed by the WCDMA standard, the pass band of the modulation of the signal is equal to 3.84 MHz, and the frequency of spacing of the tones in the case of an intermodulation test, is of the order of 10 MHz.

When the amplifier transistor is a bipolar transistor, one way of obtaining a very low circuit impedance in the first frequency range can consist in choosing this circuit impedance in such a way that its product times the maximum base current of the amplifier transistor is less than the thermodynamic voltage in a ratio of the order of around 10.

By way of indication, a circuit impedance will for example be chosen in such a way that its product times the maximum base current of this transistor is less than 1 mVolt.

Moreover, this circuit impedance is chosen in such a way that, viewed from the base or gate of the amplifier transistor, it is large as compared with the impedance of the radio frequency source in the radio frequency range of the signal.

This guarantees the transmission of a maximum number of radio frequency signals from the input terminal of the amplifier stage to the amplifier transistor.

The person of ordinary skill in the art will consequently be able to tailor this impedance to obtain this result, having regard to the envisioned application.

Nevertheless, by way of indication, the circuit impedance may be chosen in such a way that within the radio frequency range, this impedance is greater than the source impedance viewed from the base of the amplifier transistor in a ratio of the order of around 10, for example of between 10 and 20.

Moreover the use of a transconductance slaving makes it possible to obtain a negligible degradation of the noise of the stage.

According to one mode of implementation of the invention, the reference voltage is defined at least by the base/emitter or gate/source voltage of a reference transistor forming part of the slaving loop, of the same type as the amplifier transistor, (the two transistors are for example both MOS transistors, or both bipolar transistors). Moreover, the circuit impedance comprises a main resistor connected between the base or gate of the amplifier transistor and the base or gate of the reference transistor.

It is especially advantageous for the strength of the bias current to be of the order of a few percent of the current of the amplifier stage, for example of the order of 5%. In fact, this implies, a priori, a considerable area ratio of the amplifier transistor to the reference transistor, and hence a relative inaccuracy of the output current. Hence, to remedy this drawback which is encountered in the prior art, the invention makes provision, in one mode of implementation, for the amplifier transistor and the reference transistor to exhibit an area ratio at most equal to a few units, that is to say that the two areas (emitter area in the case of a bipolar transistor) may be identical, or else the area of the amplifier transistor may be greater in a ratio of a few units than that of the reference transistor. In practice, two identical transistors will be chosen for example when these transistors are bipolar transistors, or else a ratio of a few units will be chosen if the amplifier transistor is a power transistor (MOS transistor).

Also, in order to obtain both a weak bias current and a strong output current of the amplifier stage, a control current is injected into the main resistor. When the amplifier transistor is a bipolar transistor, it is for example possible to link the main resistor to a current source of the type proportional to the absolute temperature (PTAT source). The main resistor thus also exhibits a "lever" function (exponential function) in relation to the strength of the current of the amplifier stage.

When the amplifier transistor is a bipolar transistor, the base current of the reference transistor is preferably zeroed. Good accuracy is thus guaranteed for the arrangement. Specifically, the voltage drop developed in the main resistor does not then depend on this base current, which is not perfectly controlled, but would then only be strictly proportional to any control current which might flow in the main resistor and which would originate for example from a temperature-controlled current source.

The zeroing of the base current of the reference transistor may be performed by injecting a compensation current into the base of this reference transistor.

Therefore, and when a current source of the PTAT type is used, the collector current of the amplifier transistor then depends exponentially on the value of the main resistor.

It is also especially advantageous to connect a capacitor between the base or gate and the emitter or source of the reference transistor. Specifically, the base/emitter space of the reference transistor is then "shunted" by this capacitor acting as short-circuit for the radio frequency, thereby making it possible to reduce the injection of radio frequency signal into the reference transistor, and thus avoiding degrading the linearity of the arrangement.

A subject of the invention is also a device for biasing a transistor of a radio frequency amplifier stage intended for processing a modulated radio frequency signal emanating from a radio frequency source.

According to a general characteristic of the invention, it comprises closed-loop transconductance slaving means, able to slave the time average of the base/emitter or gate/source voltage of the amplifier transistor to a reference voltage corresponding to a desired quiescent current for the transistor. Moreover, viewed from the base or gate of the amplifier transistor, the impedance of the base/emitter or gate/source circuit is small at low frequency, that is to say for example in a first frequency range extending from the zero frequency (in the case of a bipolar transistor) to a predetermined frequency greater than the pass band of the modulation of the signal in a ratio of a few units, and large with respect to the impedance of the radio frequency source within the radio frequency range of the signal.

Within the radio frequency range, the circuit impedance is for example greater than the source impedance viewed from the base or gate of the amplifier transistor in a ratio of the order of around 10, for example of between 10 and 20.

According to an embodiment of the invention, the slaving means comprises a reference transistor, of the same type as the amplifier transistor, whose emitter or source is connected directly to the emitter or source of the amplifier transistor, whose base or gate is connected to the base gate of the amplifier transistor by a main resistor, and whose collector or drain is connected to the base or gate of the amplifier transistor by way of a transconductance amplifier.

According to an embodiment of the invention, the slaving means comprise an auxiliary voltage source connected to one of the inputs of the transconductance amplifier, the other input of the transconductance amplifier being connected to the collector or to the drain of the reference transistor. The auxiliary voltage delivered by the auxiliary source is fixed at a common-mode voltage chosen in such a way as to avoid saturation of the reference transistor.

The transconductance amplifier comprises for example an input transistor whose source is grounded, and whose gate is coupled to the collector or drain of the reference transistor, as well as a current mirror connected between the drain of the input transistor and the base or gate of the amplifier transistor. The common-mode auxiliary voltage then depends on the gate/source voltage of the input transistor.

The amplifier transistor may be bipolar.

In this case, in the first frequency range, the product of the circuit impedance times the maximum base current of the amplifier transistor is chosen for example to be less than the thermodynamic voltage in a factor of the order of around 10.

The device moreover comprises, advantageously, zeroing means able to zero the base current of the reference transistor.

The zeroing means may comprise for example a compensation circuit able to inject a compensation current onto the base of the reference transistor.

The reference transistor collector is biased by a biasing source.

In addition, according to one embodiment of the invention the compensation circuit comprises
- a compensation transistor analogous to the reference transistor as regards the emitter area, and as regards the biasing point,
- a current mirror connected on the one hand to the respective collectors of the reference transistor and of the compensation transistor, and on the other hand to the biasing source,
- a transconductance auxiliary amplifier of the same type as the transconductance amplifier of the slaving means, and connected between the collector and the base of the compensation transistor.

According to an embodiment of the invention, the device furthermore comprises a generator of the proportional to the absolute temperature type, connected to the main resistor and able to inject a control current into the main resistor.

In this case, and according to an embodiment of the invention, the generator of the proportional to the absolute temperature type comprises two bipolar transistors coupled by their bases, having the emitters coupled by an auxiliary resistance, and the collectors coupled by a current mirror. These two transistors are fed back in terms of current between collector and emitter in such a way that the current injected into the main resistor is proportional to the temperature, inversely proportional to the auxiliary resistance, and depends on the emitter area ratio of the two transistors.

The amplifier stage may be of the common emitter type or else of the common base type. In the latter case, a capacitor for decoupling the frequency RF (radio frequency) is connected between the base of the amplifier transistor and ground.

The amplifier transistor may also be an MOS transistor.

Regardless of the type of the amplifier transistor (MOS or bipolar), the slaving means advantageously comprises a capacitor forming a radio frequency short-circuit, connected between the base or gate and the emitter or source of the reference transistor.

Regardless of the variant used, the device is advantageously embodied in the form of an integrated circuit.

The subject of the invention is also a remote terminal, for example a cellular mobile telephone, of a wireless communication system, incorporating a biasing device as defined hereinabove.

In FIG. 1, the reference ETRF designates a radio frequency amplifier stage, comprising an amplifier transistor Q1, here a bipolar transistor, whose collector is coupled to the supply voltage by way of a radio frequency load CRF. Moreover, the emitter of the amplifier transistor Q1 is coupled to ground by an impedance CRE, generally inductive and resistive, whether it be real or stray.

Although the invention is not limited thereto, the amplifier transistor Q1 is intended to operate here in class A, that is to say in the linear region.

The radio frequency signal to be amplified is received on a radio frequency input and is delivered on the base of the transistor Q1 by way of a capacitor C1.

In general, the radio frequency stage according to the invention can operate equally well in a transmission circuit or a reception circuit, and in particular in the transmission and/or reception circuits of remote terminals, such as a cellular mobile telephone TP belonging to a wireless communication system, and it being so regardless of the transmission standard used, for example the GSM standard or else the WCDMA standard.

Thus, by way of indication, such a stage ETRF can be incorporated within a low noise amplifier, present at the head end of a reception chain. For transmission, it can form part of a power preamplifier or of a power amplifier, it then being possible for the bipolar transistor Q1 to be an MOS transistor (as represented dashed in FIG. 1).

With this amplifier, transistor Q1 is associated with a biasing device DPL, whose structure will now be described in greater detail while referring more specifically to FIGS. 2 to 5 which pertain more specifically to a common-emitter arrangement.

Figure 2:
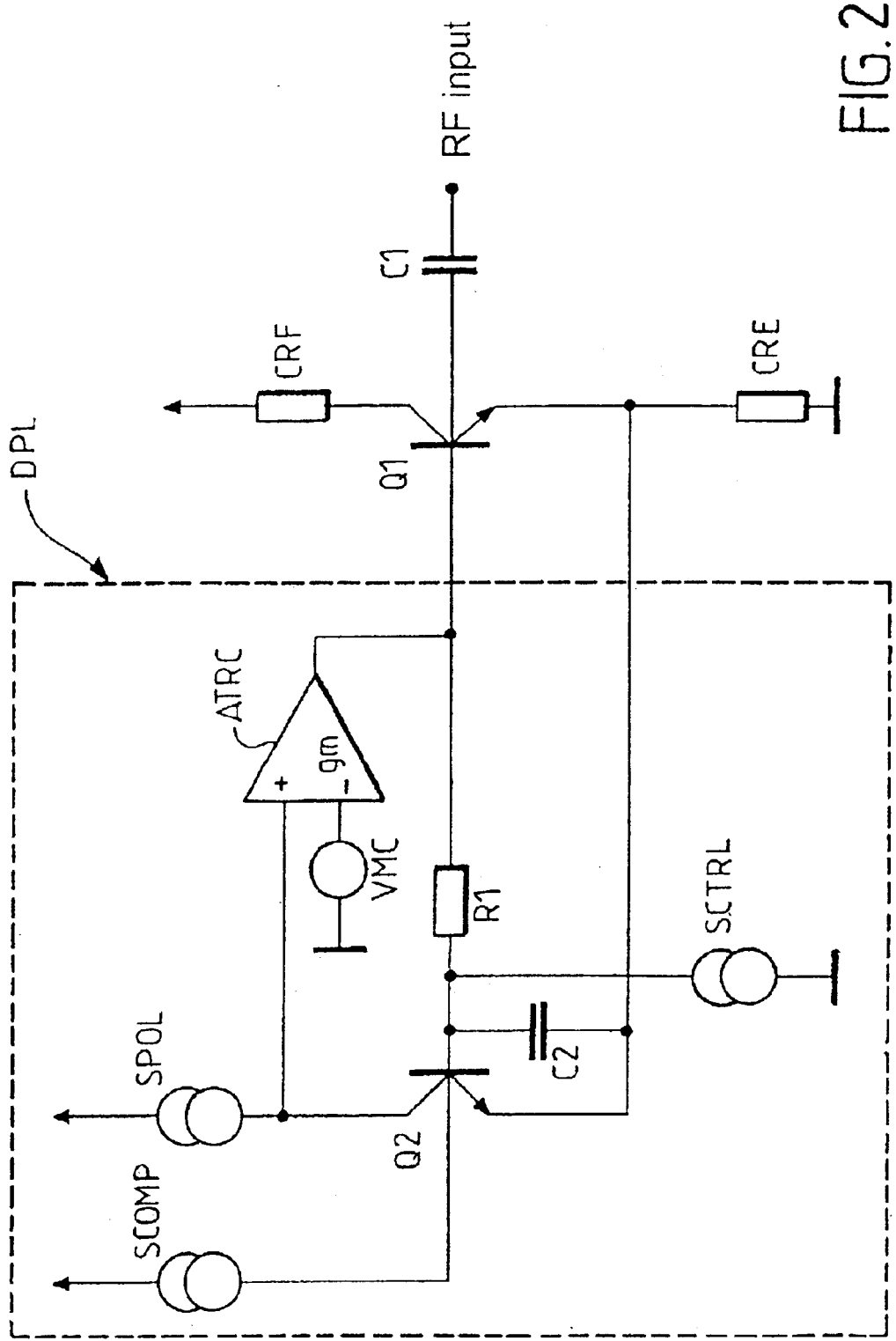
FIG. 2 illustrates again diagrammatically but in greater detail, an embodiment of a biasing device, according to the invention.

As illustrated in FIG. 2, the biasing device DPL comprises a current mirror consisting of the amplifier transistor Q1 and of a bipolar reference transistor Q2, these two transistors here having the same emitter area.

It should be noted henceforth that this current mirror is distinct from the conventional current mirrors, because this current mirror is in fact here "unbalanced" since there is provided just one main resistor R1 connected between the respective bases of the transistors Q1 and Q2.

The current mirror Q1 and Q2 is looped by an amplifier ATRC, with transconductance, of value gm, which fixes the collector potential of the reference transistor Q2 at an arbitrary common-mode value equal to that of an auxiliary voltage source VMC, whose value is chosen in such a way that the transistor Q2 does not saturate.

Moreover, the emitter of the reference transistor Q2 is connected directly to the emitter of the amplifier transistor Q1. Stated otherwise, the emitter of the transistor Q2 is brought to the potential of that of the transistor Q1, and not to ground, thereby allowing control of the time average of the base/emitter voltage of the transistor Q1, and not of a voltage which would be equal to the sum of this base/emitter voltage and of a voltage drop in the emitter load CRE, which would lead to a further degradation in the compression of the stage ETRF. Also, the arrangement according to the invention allows, through this direct connection between the two emitters of the transistors Q1 and Q2, an improvement in the stage compression point as well as an improvement in linearity.

Stated otherwise, closed-loop transconductance slaving means have been made here, which are able to slave the time average of the base/emitter voltage of the amplifier transistor Q1 to a reference voltage, defined here by the base/emitter voltage of the reference transistor Q2, and corresponding to a desired quiescent current for the amplifier transistor Q1.

The choice of a transconductance amplifier makes it possible to minimize the noise brought back by the biasing device DPL onto the radio frequency stage ETRF.

Viewed from the base of the transistor Q1, the base/emitter circuit impedance must be high in the radio frequency range of the signal, as compared with the impedance of the radio frequency source from which the radio frequency signal stems. In general, this impedance of the radio frequency source is defined by an impedance matching device and generally confers a value of the order of 50 Ohms on this source impedance. However, this source impedance may vary between 25 and 200 Ohms.

Also, a resistance R1 of ten to twenty times greater than the source impedance will be chosen, that is to say a resistance R1 having a value of between 250 and 4000 Ohms.

The transmission of a maximum of radio frequency input signal from the radio frequency input terminal to the transistor Q1 is guaranteed due to the exhibiting of high impedance in the radio frequency range.

Moreover, viewed from the base of the transistor Q1, the impedance of the base/emitter circuit is chosen in such as way as to be small in a frequency range extending from the zero frequency (DC current) to a predetermined frequency which is greater than the pass band of the modulation of the signal in a ratio of a few units, for example of the order of two to five times the pass band of the modulation of the signal.

The compression point of the stage and also the linearity performance of this stage are improved due to the exhibiting of a low impedance under DC current and at low frequency.

The base/emitter circuit impedance will, for example, be chosen in such a way that in the first frequency range, the product of this circuit impedance times the maximum base current of the amplifier transistor Q1 is less than the thermodynamic voltage Ut in a factor of the order of around ten. It is recalled here that the thermodynamic voltage is equal to 26 mV at 300° K. By way of example, a circuit impedance will be chosen, for a bipolar transistor, in such a way that its product times the maximum base current of the transistor Q1 is less than 1 mV.

In the radio frequency range, the base/emitter circuit impedance is determined essentially by the value of the main resistor R1, since in this frequency range the transconductance amplifier no longer reacts. On the other hand, at low frequency the slaving operates and the impedance of the base/emitter circuit is then equal to the sum of the resistance R1 and of the input impedance of the reference transistor Q1 divided by the loop gain which may be of the order of 10,000.

An impedance of the base/emitter circuit, seen from the base of the transistor Q1, which is very small at low frequency is therefore indeed obtained here.

Apart from these slaving means, the biasing device moreover comprises a compensation circuit SCOMP intended for injecting a compensation current ICOMP into the base of the transistor Q2 in such as way as to zero the base current of the transistor Q2. Thus, the voltage drop developed in the resistor R1 is then only proportional to a control current ICTRL delivered by a current source SCTRL and not to a current which would result from the combination of the current ICTRL and of the base current of the transistor Q2. This consequently increases the accuracy of the arrangement.

Moreover, the base/emitter space of the reference transistor Q2 is shunted by a decoupling capacitor C2 acting as short-circuit for the radio frequency, thereby making it possible to reduce the injection of radio frequency signal into the reference transistor Q2 and thus avoiding degrading the linearity of the arrangement.

Moreover, it is easily shown that the voltage drop across the terminals of the resistor R1 has an exponential effect on the collector current of the transistor Q1. More precisely, if the control current ICTRL injected into the resistor R1 emanates from a current source proportional to the absolute temperature, it is then shown that the collector current of the transistor Q1 may be written according to formula (I) below:

$$IC1 = \lambda^{(2R1/R2)} \cdot IPOL \qquad (I)$$

in which:
 $\lambda$ is a constant,
 R2 is an auxiliary resistance belonging to the current source STRL,
 and IPOL is the biasing current of the transistor Q2 delivered by a biasing source SPOL.

The person of ordinary skill in the art will consequently have noted that the resistor R1 has a lever effect on the value of the collector current of the transistor Q1 (output current from the stage ETRF).

So, it is thus possible to obtain large collector currents with a small biasing current IPOL, this having a considerable impact on the consumption of the biasing device DPL, and making it possible to produce transistors Q1 and Q2 having one and the same emitter area, this also having a positive impact on the accuracy of the output current.

Figure 3:
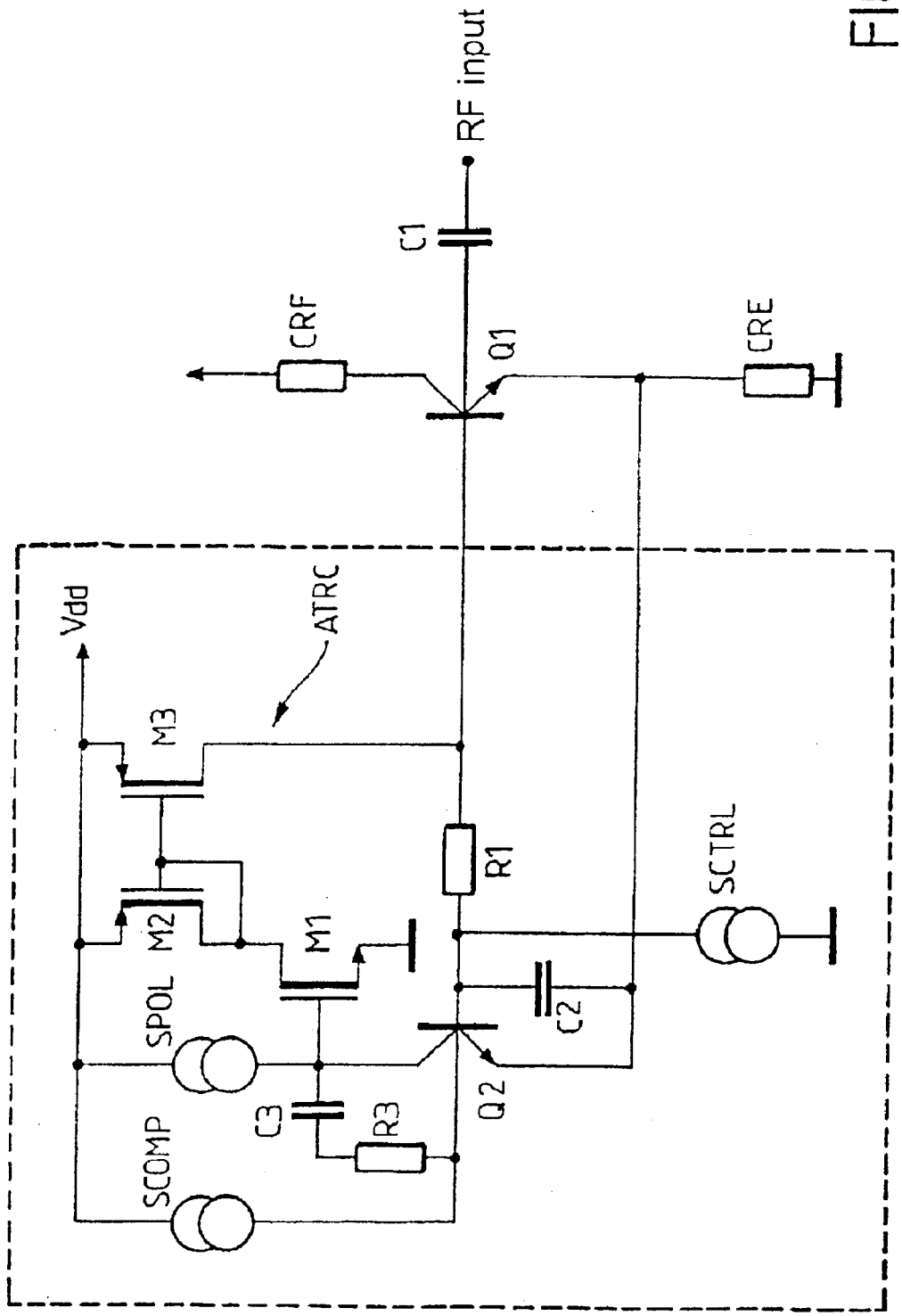
FIG. 3 illustrates diagrammatically but in greater detail, a transconductance closed-loop slaving of the biasing device of FIG. 2.

Reference will now be made more specifically to FIG. 3 to describe a preferred embodiment of the amplifier with transconductance ATRC of the slaving means.

In this embodiment, the amplifier with transconductance ATRC is made up of an MOS transistor referenced M1 and of a current mirror formed of two MOS transistors referenced M2 and M3.

The source of the transistor M1 is coupled to ground, while the gate of the transistor M1 is coupled to the collector of the transistor Q2. The auxiliary voltage VMC (FIG. 1) is therefore here the ground.

A compensation network formed of a capacitor C3 and of a resistor R3, and connected between the collector and the base of the transistor Q2, makes it possible to create the dominant pole of the loop and also has the functions of stabilizing this loop and of filtering the signal.

This transconductance amplifier topology with a single input transistor (transistor M1) has the advantage of fixing simply the common-mode potential of the transistor Q2 through the value of the gate/source voltage of the transistor M1 (possibly the gate/source voltage increased by a series voltage in the source). In this way matters may be contrived so as to operate the transistor Q2 with a quasi-zero collector/base voltage, thereby leaving a greater margin for maneuvering in order to synthesize the biasing source SPOL, particularly in the case of a common-base arrangement (which will be explained in greater detail in FIG. 6), as regards applications operating with low supply voltages (2.7 Volts or less).

Moreover, the radio frequency noise current injected by this transconductance amplifier into the stage ETRF is limited, since it is reduced mainly to the noise of the slope of the transistor M3 which may be minimized.

The noise contribution from such biasing on a low noise amplifier (such as those with which cellular mobile telephones are equipped) having a noise factor of the order of 1.5 dB was therefore able to be rendered negligible, that is to say less than 0.1 dB, all drifting included.

Figure 4:
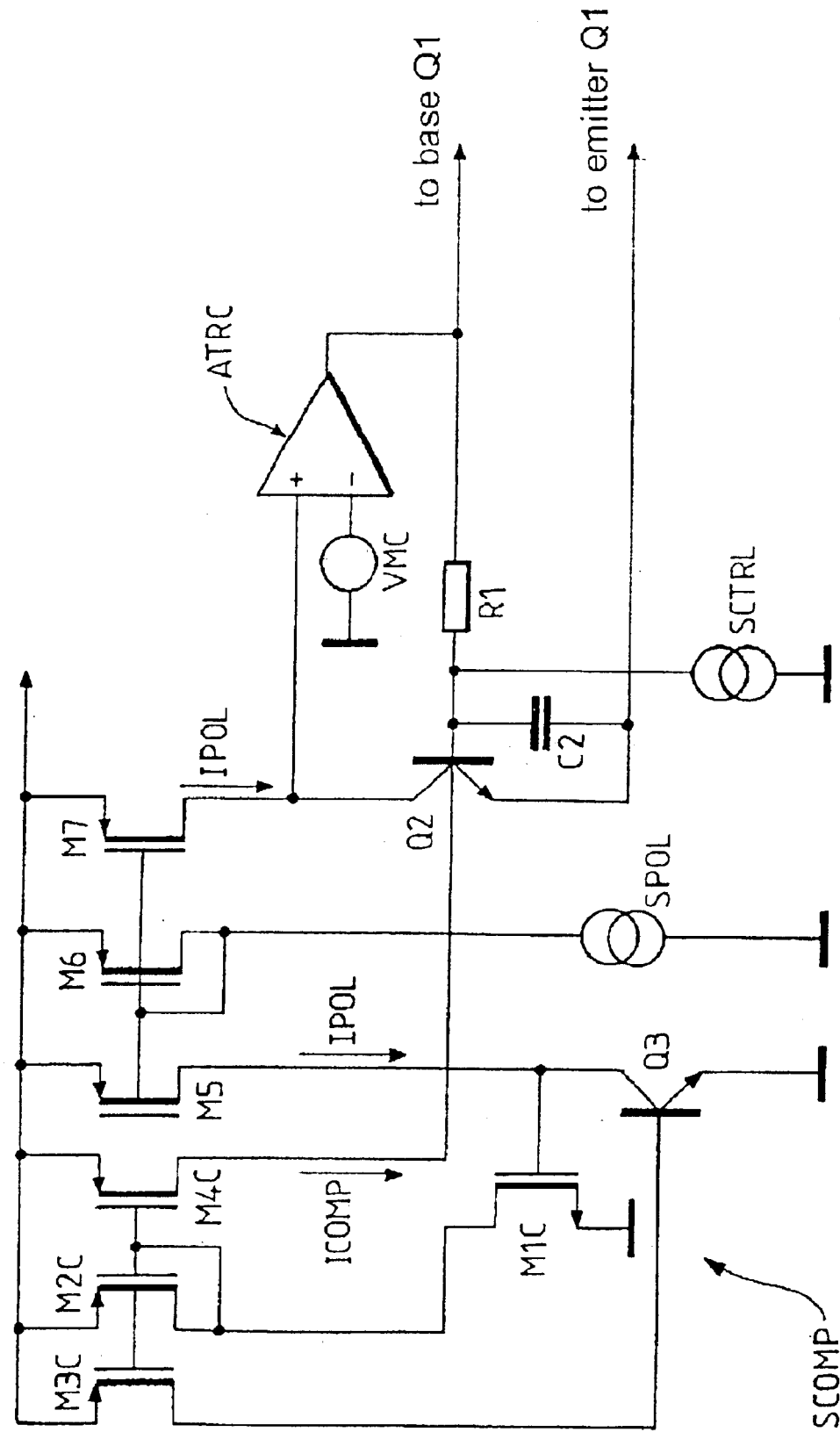
FIG. 4 illustrates in greater detail but still diagrammatically, an embodiment of a circuit for compensation of a biasing device according to the invention.

Reference is now made more specifically to FIG. 4 to describe a preferred embodiment of the compensation circuit SCOMP, which, by injection of a compensation current ICOMP into the base of the transistor Q2, makes it possible to zero this base current in such a way that the voltage drop developed in the resistor R1 is strictly proportional to the control current ICTRL alone.

This compensation circuit SCOMP comprises a compensation transistor Q3, analogous to the reference transistor Q2, that is to say exhibiting in particular an emitter area equal to that of the reference transistor Q2, as well as an identical bias point.

The compensation circuit moreover comprises a current mirror formed of three MOS transistors referenced M5, M6, M7, connected on the one hand to the respective collectors of the reference transistor Q2 and of the compensation transistor Q3, and on the other hand to the biasing source SPOL, which allows identical biasing of Q2 and Q3.

The compensation circuit also comprises an auxiliary transconductance amplifier formed of the three MOS transistors referenced M1C, M2C and M3C, this auxiliary transconductance amplifier being of the same type as the transconductance amplifier ATRC of the slaving means. It is connected between the collector and the base of the compensation transistor Q3.

The compensation transistor Q3 is thus biased by the same current IPOL as the transistor Q1, and the base current of the compensation transistor Q3 serves as compensation current ICOMP.

Moreover, as the transistor M1C and its counterpart M1 (FIG. 3) are not biased to similar current levels, the geometry of the transistor M1C should be chosen such that its gate-source voltage is substantially equal to the gate-source voltage of the transistor M1, the source of the transistor M1C being connected to the same potential as the source of the transistor M1.

Furthermore, the transistors M3C and M4C should preferably be very well paired, as should the transistors M5 and M7.

Figure 5:
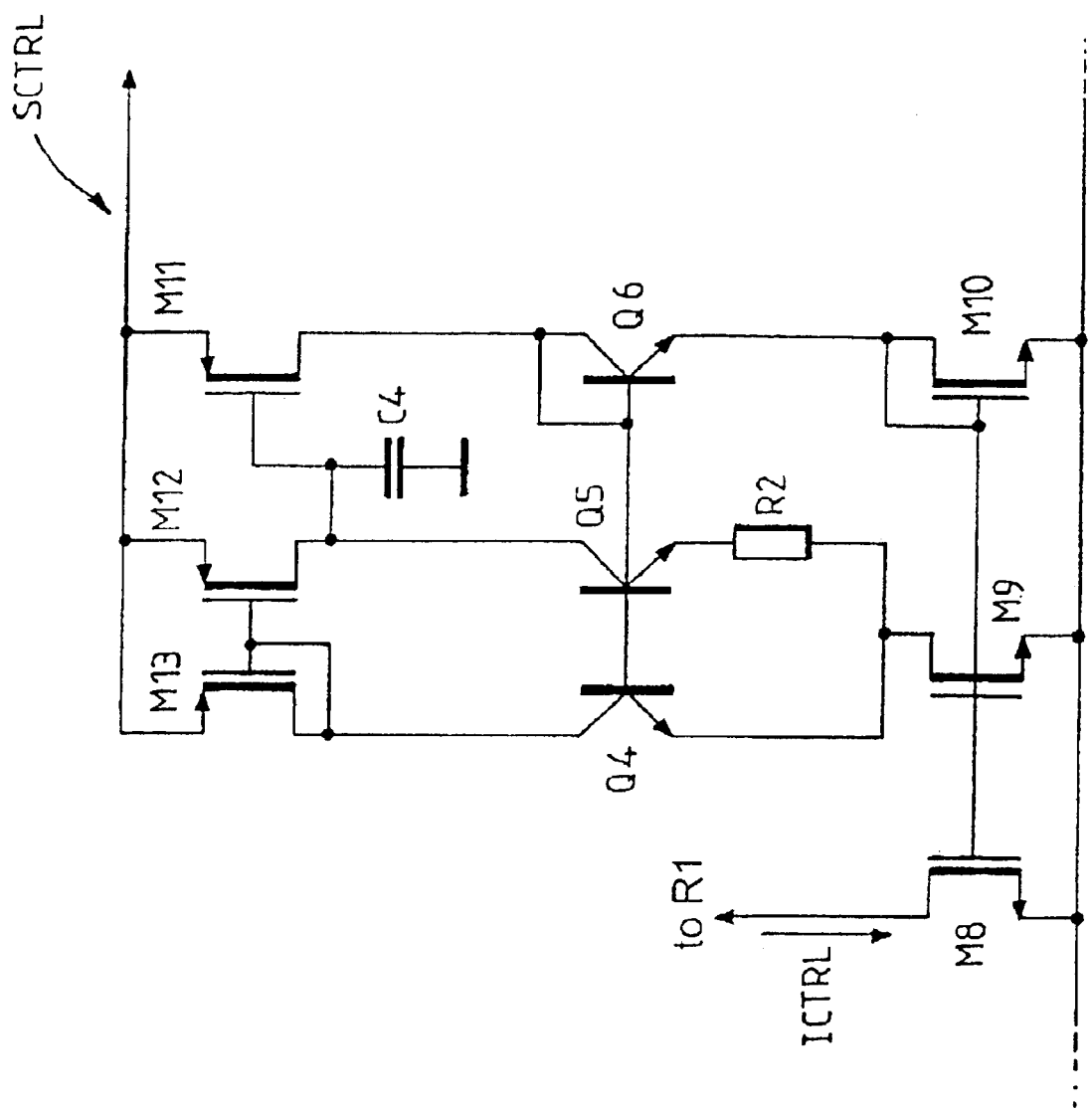
FIG. 5 illustrates diagrammatically but in greater detail an embodiment of a generator of a controlled voltage proportional to the absolute temperature, according to the invention.

Reference is now made more specifically to FIG. 5 to describe a preferred embodiment of the current source STRL, which in this instance is proportional to absolute temperature.

This current source SCTRL comprises two bipolar transistors Q4 and Q5, coupled by their bases. The emitters of these two transistors are also coupled by way of an auxiliary resistor R2, and their respective collectors are coupled by a current mirror M12, M13.

These two transistors Q4 and Q5 are fed back in terms of current between collectors and emitters by way of the transistors M9, M10 and M11, so that the control current ICTRL is equal to the sum of the emitter currents of the transistors Q4 and Q5. Moreover this current ICTRL, which is also equal to the current flowing in the transistors M8 and M9 (to within the pairing of the transistors M8 and M9), is defined by the following formula (II):

$$ICTRL = 2Ut \cdot Ln(\lambda)/R2 \qquad (II)$$

in which:

Ut designates the thermodynamic voltage, Ln the Napierian logarithm function, $\lambda$ the ratio of the current densities, that is to say the ratio of the geometries of the transistors ($\lambda = A5/A4$, where A5 and A4 respectively designate the emitter areas of the transistors Q5 and Q4).

It will be noted here that the current ICTRL does not depend (to first order) on the DC current gains of the transistors Q4 and Q5. Therefore, the temperature drifting of the radio frequency quiescent currents which is engendered in this manner complies very well (to within 1%) with the temperature drifting of the incoming quiescent current IPOL.

The invention is not limited to the embodiments and modes of implementation just described, but embraces all variants thereof.

Figure 6:
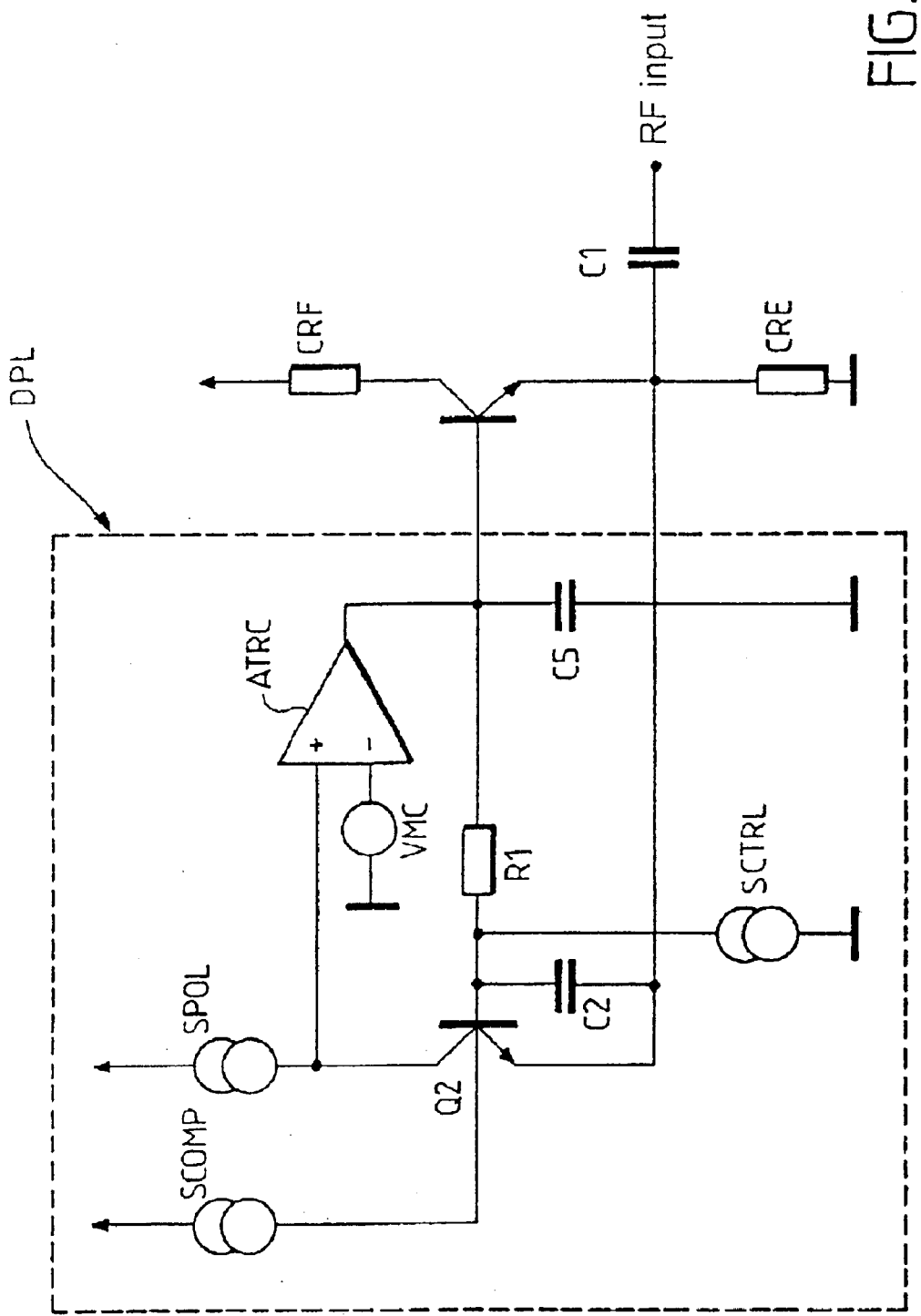
FIG. 6 illustrates diagrammatically another embodiment of a biasing device according to the invention, of the common-base arrangement type.

Thus, the invention applies also to a stage ETRF of common-base type, as illustrated in FIG. 6. In this arrangement, a capacitor C5, connected between the base of the transistor Q1 and the ground, allows effective decoupling of this base.

The transistor Q1 can also be an MOS transistor, by dint of a few modifications of the biasing device DPL, within the scope of the person of ordinary skill in the art. Thus, for example, the compensation circuit SCOMP is no longer necessary since the reference transistor Q2, which then becomes an MOS transistor, does not exhibit a static gate current.

Likewise, the low nature of the gate/source circuit impedance of the transistor Q1 at low frequency, that is to say in the first frequency range mentioned above with the exception of the zero frequency, can then be manifested for example by the fact that the product of this circuit impedance times the maximum gate current of the transistor is less than $VGS_0 - Vt$ in a factor of the order of around ten ($VGS_0$ and Vt respectively designating the quiescent gate/source voltage, and the threshold voltage of the transistor).

Moreover, at zero frequency (DC current), the value of this circuit impedance is of no importance since the MOS transistor exhibits no static gate current. It is then in theory possible to choose at zero frequency a low or high impedance. In practice, the decision criterion in respect of the value of this circuit impedance will be the criterion used for the low frequencies.

Finally, obviously in the case of an MOS transistor, the term area should be understood as relating to the ratio W/L (W: channel width and L: channel length).

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

We claim:

1. A method of biasing a transistor of a radio frequency amplifier stage, the method comprising:
    receiving an input signal at an amplifier transistor, the input signal being provided from a radio frequency signal source;
    closed-loop transconductance slaving a time average voltage of a base/emitter or gate/source of the amplifier transistor to a reference voltage corresponding to a desired quiescent current for the amplifier transistor; and setting an input circuit impedance of a base/emitter or gate/source circuit of the amplifier transistor, as viewed from the base or gate of the amplifier transistor, to a small value at a low frequency of the input signal, and to a large value with respect to an output circuit impedance of the radio frequency signal source at a radio frequency of the input signal.

2. The method according to claim 1, wherein the input circuit impedance of the amplifier transistor is set in such a way that within a radio frequency range for the input signal, this input circuit impedance being viewed from the base or gate of the amplifier transistor, is greater than the radio frequency signal source output circuit impedance in a ratio of the order of around 10, for example between 10 and 20.

3. The method according to claim 1, wherein the amplifier transistor is a bipolar transistor.

4. The method according to claim 1, wherein the input circuit impedance is set in such a way that in a first frequency range extending from the zero frequency up to a predetermined frequency greater than a passband of modulation of the input signal in a ratio of a few units, the product of this input circuit impedance times the base or gate current of the amplifier transistor is less than the thermodynamic voltage in a factor of the order of around 10.

5. The method according to claim 1, wherein the amplifier transistor is an MOS transistor.

6. The method according to claim 5, wherein the gate/source circuit impedance is chosen in such a way that within a first frequency range excluding the zero frequency and extending up to a predetermined frequency greater than the passband of the modulation of the signal in a ratio of a few units, the product of this impedance times the maximum gate current of the amplifier transistor is less than $VGS_0-Vt$ in a factor of the order of around 10, $VGS_0$ and $Vt$ respectively designating the quiescent gate/source voltage and the threshold voltage of the transistor.

7. The method according to claim 1, wherein the reference voltage is defined at least by the base/emitter or gate/source voltage of a reference transistor, of the same type as the amplifier transistor, forming part of a slaving loop, and in that the input circuit impedance comprises a resistor connected between the base or gate of the amplifier transistor and the base or gate of the reference transistor.

8. The method according to claim 7, wherein the area ratio of the amplifier transistor to the reference transistor can vary from one to a few units.

9. The method according to claim 7, wherein the amplifier transistor is a bipolar transistor.

10. The method according to claim 7, wherein the input circuit impedance is set in such a way that in a first frequency range extending from the zero frequency up to a predetermined frequency greater than a passband of modulation of the input signal in a ratio of a few units, the product of this input circuit impedance times the base or gate current of the amplifier transistor is less than the thermodynamic voltage in a factor of the order of around 10.

11. The method according to claim 7, wherein the base current of the reference transistor is zeroed.

12. The method according to claim 11, wherein the base current of the reference transistor is zeroed by injecting a compensation current into the base of this reference transistor.

13. The method according to claim 7, wherein a control current is injected into the resistor by linking it to a current source of the proportional to the absolute temperature type.

14. The method according to claim 7, wherein the amplifier transistor is an MOS transistor.

15. The method according to claim 14, wherein the gate/source circuit impedance is chosen in such a way that within a first frequency range excluding the zero frequency and extending up to a predetermined frequency greater than the passband of the modulation of the signal in a ratio of a few units, the product of this impedance times the maximum gate current of the amplifier transistor is less than $VGS_0-Vt$ in a factor of the order of around 10, $VGS_0$ and $Vt$ respectively designating the quiescent gate/source voltage and the threshold voltage of the transistor.

16. The method according to claim 15, wherein the same circuit impedance is chosen at the zero frequency and within the first frequency range.

17. The method according to claim 7, wherein a capacitor is connected between the base or gate and the emitter or source of the reference transistor.

18. An electronic device for biasing a transistor of a radio frequency amplifier stage intended for processing a modulated radio frequency signal emanating from a radio frequency source, the electronic device comprising:
    an input at an amplifier transistor for receiving an input signal provided from a radio frequency signal source; and
    closed-loop transconductance slaving means for slaving a time average voltage of the base/emitter or gate/source voltage of the amplifier transistor to a reference voltage corresponding to a desired quiescent current for the amplifier transistor, and wherein an input circuit impedance of a base/emitter or gate/source circuit of the amplifier transistor, as viewed from the base or gate of the amplifier transistor, the input circuit impedance of the base/emitter or gate/source circuit is a small value at a low frequency of the input signal, and large value with respect to an output circuit impedance of the radio frequency signal source at a radio frequency of the input signal.

19. The electronic device according to claim 18, wherein within a radio frequency range for the input signal, the input circuit impedance is greater than the radio frequency signal source output circuit impedance, as viewed from the base or gate of the amplifier transistor, in a ratio of the order of around 10, for example of between 10 and 20.

20. The electronic device according to claim 18, wherein the amplifier transistor is a bipolar transistor.

21. The electronic device according to claim 18, wherein in a first frequency range extending from the zero frequency up to a predetermined frequency greater than a passband of modulation of the input signal in a ratio of a few units, the product of the input circuit impedance times the base current of the amplifier transistor is less than the thermodynamic voltage in a factor of the order of around 10.

22. The electronic device according to claim 21, wherein the amplifier stage is of the common emitter type.

23. The electronic device according to claim 21, wherein the amplifier stage is of the common base type, and in that a radio frequency decoupling capacitor is connected between the base of the amplifier transistor and ground.

24. The electronic device according to claim 18, wherein the amplifier transistor is an MOS transistor.

25. The electronic device according to claim 24, wherein within a first frequency range excluding the zero frequency and extending up to a predetermined frequency greater than the passband of the modulation of the signal in a ratio of a few units, the product of the gate/source impedance times the maximum gate current of the amplifier transistor is less than $VGS_0-Vt$ in a factor of the order of around 10, $VGS_0$ and $Vt$ respectively designating the quiescent gate/source voltage and the threshold voltage of the transistor.

26. The electronic device according to claim 25, wherein the circuit impedance is identical at zero frequency and within the first frequency range.

27. The electronic device according to claim 18, wherein the electronic device is embodied in the form of an integrated circuit.

28. The electronic device according to claim 18, wherein the slaving means comprises a reference transistor, of the same type as the amplifier transistor, whose emitter or source is connected directly to the emitter or source of the amplifier transistor, whose base or gate is connected to the base or gate of the amplifier transistor by a main resistor, and whose collector or drain is connected to the base or gate of the amplifier transistor by way of a transconductance amplifier.

29. The electronic device according to claim 28, wherein the slaving means comprise an auxiliary voltage source connected to one of the inputs of the transconductance amplifier, the other input of the transconductance amplifier being connected to the collector or to the drain of the reference transistor, and in that the auxiliary voltage delivered by the auxiliary voltage source is fixed at a common-mode voltage chosen in such a way as to avoid saturation of the reference transistor.

30. The electronic device according to claim 29, wherein the transconductance amplifier comprises an input transistor whose source is coupled to ground, and whose gate is coupled to the collector or drain of the reference transistor, as well as a current mirror connected between the drain of the input transistor and the base or gate of the amplifier transistor, and in that the common-mode auxiliary voltage depends on the gate/source voltage of the input transistor.

31. The electronic device according to claim 28, wherein the area ratio of the amplifier transistor to the reference transistor can vary from one to a few units.

32. The electronic device according to claim 28, wherein the amplifier transistor is a bipolar transistor.

33. The electronic device according to claim 32, wherein in a first frequency range extending from the zero frequency up to a predetermined frequency greater than a passband of modulation of the input signal in a ratio of a few units, the product of the input circuit impedance times the base current of the amplifier transistor is less than the thermodynamic voltage in a factor of the order of around 10.

34. The electronic device according to claim 32, wherein the electronic device comprises zeroing means for zeroing the base current of the reference transistor.

35. The electronic device according to claim 34, wherein the zeroing means comprise a compensation circuit able to inject a compensation current onto the base of the reference transistor.

36. The electronic device according to claim 35, wherein the reference transistor collector is biased by a biasing source, and in that the compensation circuit comprises
 a compensation transistor analogous to the reference transistor as regards the emitter area, and as regards the biasing point,
 a current mirror connected on the one hand to the respective collectors of the reference transistor and of the compensation transistor, and on the other hand to the biasing source,
 a transconductance auxiliary amplifier of the same type as the transconductance amplifier of the slaving means, and connected between the collector and the base of the compensation transistor.

37. The electronic device according to claim 28, wherein the electronic device furthermore comprises a generator of the proportional to the absolute temperature type, connected to the main resistor and able to inject a control current into the main resistor.

38. The electronic device according to claim 37, wherein the generator comprises two bipolar transistors coupled by their base, having the emitters coupled by an auxiliary resistance, and the collectors coupled by a current mirror, and in that these two transistors are fed back in terms of current between collector and emitter in such a way that the current injected into the main resistor is proportional to the temperature, inversely proportional to the auxiliary resistance, and depends on the emitter area ratio of the two transistors.

39. The electronic device according to claim 37, wherein the amplifier stage is of the common emitter type.

40. The electronic device according to claim 37, wherein the amplifier stage is of the common base type, and in that a radio frequency decoupling capacitor is connected between the base of the amplifier transistor and ground.

41. The electronic device according to claim 28, wherein the amplifier transistor is an MOS transistor.

42. The electronic device according to claim 41, wherein within a first frequency range excluding the zero frequency and extending up to a predetermined frequency greater than the passband of the modulation of the signal in a ratio of a few units, the product of the gate/source impedance times the maximum gate current of the amplifier transistor is less than $VGS_0-Vt$ in a factor of the order of around 10, $VGS_0$ and Vt respectively designating the quiescent gate/source voltage and the threshold voltage of the transistor.

43. The electronic device according to claim 28, wherein the slaving means comprises a capacitor forming a radio frequency short-circuit connected between the base or gate and the emitter or source of the reference transistor.

44. The electronic device according to claim 28, wherein the electronic device is embodied in the form of an integrated circuit.

45. A remote terminal of a wireless communication system, wherein the remote terminal comprises an electronic device for biasing a transistor of a radio frequency amplifier stage intended for processing a modulated radio frequency signal emanating from a radio frequency source, the electronic device comprising:
 an input at an amplifier transistor for receiving an input signal provided from a radio frequency signal source; and
 closed-loop transconductance slaving means for slaving a time average voltage of the base/emitter or gate/source voltage of the amplifier transistor to a reference voltage corresponding to a desired quiescent current for the amplifier transistor, and wherein an input circuit impedance of a base/emitter or gate/source circuit of the amplifier transistor, as viewed from the base or gate of the amplifier transistor, the input circuit impedance of the base/emitter or gate/source circuit is a small value at a low frequency of the input signal, and large value with respect to an output circuit impedance of the radio frequency signal source at a radio frequency of the input signal.

46. The electronic device according to claim 45, wherein within a radio frequency range for the input signal, the input circuit impedance is greater than the radio frequency signal source output circuit impedance, as viewed from the base or gate of the amplifier transistor, in a ratio of the order of around 10, for example of between 10 and 20.

47. The electronic device according to claim 45, wherein the amplifier transistor is a bipolar transistor.

48. The electronic device according to claim 45, wherein in a first frequency range extending from the zero frequency up to a predetermined frequency greater than a passband of modulation of the input signal in a ratio of a few units, the product of the input circuit impedance times the base current of the amplifier transistor is less than the thermodynamic voltage in a factor of the order of around 10.

49. The electronic device according to claim 45, wherein the amplifier stage is of the common emitter type.

50. The electronic device according to claim 45, wherein the amplifier stage is of the common base type, and in that a radio frequency decoupling capacitor is connected between the base of the amplifier transistor and ground.

51. The electronic device according to claim 45, wherein the amplifier transistor is an MOS transistor.

52. The electronic device according to claim 45, wherein the slaving means comprises a reference transistor, of the same type as the amplifier transistor, whose emitter or source is connected directly to the emitter or source of the amplifier transistor, whose base or gate is connected to the base or gate of the amplifier transistor by a main resistor, and whose collector or drain is connected to the base or gate of the amplifier transistor by way of a transconductance amplifier.

53. The electronic device according to claim 52, wherein the slaving means comprise an auxiliary voltage source connected to one of the inputs of the transconductance amplifier, the other input of the transconductance amplifier being connected to the collector or to the drain of the reference transistor, and in that the auxiliary voltage delivered by the auxiliary voltage source is fixed at a common-mode voltage chosen in such a way as to avoid saturation of the reference transistor.

54. The electronic device according to claim 53, wherein the transconductance amplifier comprises an input transistor whose source is coupled to ground, and whose gate is coupled to the collector or drain of the reference transistor, as well as a current mirror connected between the drain of the input transistor and the base or gate of the amplifier transistor, and in that the common-mode auxiliary voltage depends on the gate/source voltage of the input transistor.

55. The electronic device according to claim 52, wherein the electronic device furthermore comprises a generator of the proportional to the absolute temperature type, connected to the main resistor and able to inject a control current into the main resistor.

56. The electronic device according to claim 55, wherein the generator comprises two bipolar transistors coupled by their base, having the emitters coupled by an auxiliary resistance, and the collectors coupled by a current mirror, and in that these two transistors are fed back in terms of current between collector and emitter in such a way that the current injected into the main resistor is proportional to the temperature, inversely proportional to the auxiliary resistance, and depends on the emitter area ratio of the two transistors.

57. The electronic device according to claim 55, wherein the amplifier stage is of the common emitter type.

58. The electronic device according to claim 55, wherein the amplifier stage is of the common base type, and in that a radio frequency decoupling capacitor is connected between the base of the amplifier transistor and ground.

59. A remote terminal according to claim 45, wherein the remote terminal comprises a cellular mobile telephone.

* * * * *

UNITED STATES PATENT AND TRADEMARK OFFICE
CERTIFICATE OF CORRECTION

PATENT NO. : 6,778,019 B2
DATED : August 17, 2004
INVENTOR(S) : Jean-Charles Grasset et al.

It is certified that error appears in the above-identified patent and that said Letters Patent is hereby corrected as shown below:

<u>Title page,</u>
Item [30], Foreign Application Priority Data, please add the following:
-- Dec. 20, 2001 (FR) ......................... 01 16600 --

Signed and Sealed this

First Day of February, 2005

JON W. DUDAS
*Director of the United States Patent and Trademark Office*